(12) United States Patent
Qin et al.

(10) Patent No.: US 8,368,081 B2
(45) Date of Patent: Feb. 5, 2013

(54) METAL THIN FILM CONNECTION STRUCTURE, MANUFACTURING METHOD THEREOF AND ARRAY SUBSTRATE

(75) Inventors: Wei Qin, Beijing (CN); Zhilong Peng, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/150,406

(22) Filed: Jun. 1, 2011

(65) Prior Publication Data

US 2011/0304060 A1   Dec. 15, 2011

(30) Foreign Application Priority Data

Jun. 9, 2010   (CN) ............... 2010 1 0201391

(51) Int. Cl.
*H01L 29/04*   (2006.01)
*H01L 23/52*   (2006.01)
*H01L 23/48*   (2006.01)
*H01L 21/768*   (2006.01)
*H01L 21/4763*   (2006.01)

(52) U.S. Cl. .......... 257/72; 257/758; 257/750; 257/774; 257/E21.575; 438/637

(58) Field of Classification Search ............ 257/72, 257/758, 750, 774, E21.575; 438/637
See application file for complete search history.

(56) References Cited

U.S. PATENT DOCUMENTS

| | | | |
|---|---|---|---|
| 6,836,301 B1 * | 12/2004 | Kohtaka et al. | 349/43 |
| 2004/0109102 A1 | 6/2004 | Chang et al. | |
| 2006/0284633 A1 * | 12/2006 | Park | 324/765 |
| 2007/0109467 A1 * | 5/2007 | Chang et al. | 349/106 |
| 2008/0204618 A1 * | 8/2008 | Jung et al. | 349/40 |

FOREIGN PATENT DOCUMENTS

| | | |
|---|---|---|
| CN | 1507009 A | 6/2004 |
| CN | 1773357 A | 5/2006 |

* cited by examiner

*Primary Examiner* — Luan C Thai
(74) *Attorney, Agent, or Firm* — Ladas & Parry LLP

(57) ABSTRACT

Embodiments of the invention relates to a metal thin film connection structure, comprising a first metal layer pattern; a second metal layer pattern which is separately disposed with the first metal layer pattern; a first insulating layer formed on the first metal layer pattern and the second metal layer pattern; a plurality of first via holes formed over the first metal layer pattern; a plurality of second via holes formed over the second metal layer pattern; and a plurality of third metal layer patterns formed on the first insulating layer, the third metal layer patterns being filled in the first via holes and the second via holes and electrically connect the first metal layer pattern and the second metal layer pattern through the first and second via holes. The embodiments of the invention also provide an array substrate comprising the metal thin film connection structure and a manufacturing method for the metal thin film connection structure.

20 Claims, 5 Drawing Sheets

METAL THIN FILM CONNECTION STRUCTURE, MANUFACTURING METHOD THEREOF AND ARRAY SUBSTRATE

BACKGROUND

Embodiments of the present invention relate to a metal thin film connection structure, a manufacturing method thereof, and an array substrate.

A liquid crystal display is a flat panel display in common currently. Thin film transistor liquid crystal displays (TFT-LCDs) tend to dominate the current flat panel display market.

An array substrate is an important component of a liquid crystal display. FIG. 3a is a diagram showing the structure of an array substrate, and FIG. 3b is a partial enlarged view showing a metal thin film connection structure in FIG. 3a. As shown in FIGS. 3a and 3b, the array substrate comprises a pixel region 1 and a wiring region 2 which is located at the periphery of the pixel region 1. The array substrate comprises a base substrate 21 and a metal thin film connection structure formed thereon. A first metal layer pattern 22 is formed on the base substrate 21, an interlayer insulating layer is formed on the first metal layer pattern 22, a second metal layer pattern 24 is formed on the interlayer insulating layer, and an outer insulating layer is formed on the second metal layer pattern 24 (the interlayer insulating layer and the outer insulating layer are not shown in FIGS. 3a and 3b). The first metal layer pattern 22 may comprise a gate line, a common electrode line and a reparation line; and the second metal layer patter 24 may comprise a data line, a common electrode connecting line and a reparation line. The metal thin film connection structure 29 is located within the wiring region 2, and its enlarged view is shown in FIG. 3b. The metal thin film connection structure 29 comprises a plurality of columns of first via holes 26, and each column comprises a plurality of first via holes 26. The first via holes 26 are formed in the interlayer insulating layer and the outer insulating layer, and only the first metal layer pattern 22 is formed under the first via holes, and the second metal layer pattern is not. The metal thin film connection structure 29 comprises a plurality of columns of second via holes 27, and each column comprises a plurality of second via holes 27. The second via holes 27 are formed in the outer insulating layer and on the second metal layer pattern 24. A third metal layer pattern 28 is formed integrally on the outer insulating layer, and connects the first metal layer pattern 22 and the second metal layer 24 through the first via holes 26 and the second via holes 27.

During the process for designing and manufacturing an array substrate, a part of the first metal layer pattern 22 and a part of the second metal layer pattern 24 in the wiring region 2 are needed to be connected with each other. The above mentioned configuration incurs a problem that the third metal layer pattern 28 between the first via holes 26 and the second via holes 27 in the metal thin film connection structure 29 is likely overheated and burned out. FIG. 3c is an equivalent circuit diagram of the metal thin film connection structure in FIG. 3b. As shown in FIGS. 3b and 3c, because the resistances of first and second metal layer patterns 22 and 24 are much smaller than that of the third metal layer pattern 28, the resistances of the first and second metal layer patterns 22 and 24 can be omitted in FIG. 3c. In the equivalent circuit diagram in FIG. 3c, R1 and R2 are the equivalent resistors of the parts of the third metal layer pattern 28 over the second via holes 27, R5 and R6 are the equivalent resistors of the parts of the third metal layer pattern 28 over the first via holes 26, R3 and R4 are the equivalent resistors of the parts of the third metal pattern 28 between the first via holes 26 and the second via holes 27, R10 to R12 are the resistors having the contact resistances between the third metal layer pattern 28 and the first metal layer pattern 22 at the locations of the first via holes 26, and R7 to R9 are the resistors having the contact resistances between the third metal layer pattern 28 and the second metal layer pattern 24 at the locations of the second via holes 27. It can be seen from FIG. 3c that, among the currents flowing through the resistors, the current flowing through the R3 and R4 is concentrated, and the overheating and burning out tend to occur at the locations of the R3 and R4. Since the R3 and R4 are the equivalent resistors of the third metal layer pattern 28 between the first via holes 26 and the second via holes 27, the third metal layer pattern 28 between the first via holes 26 and the second via holes 27 is easily to be overheated and burned out.

SUMMARY

One embodiment of the invention provides a metal thin film connection structure, comprising: a first metal layer pattern; a second metal layer pattern which is separately disposed with the first metal layer pattern; a first insulating layer formed on the first metal layer pattern and the second metal layer pattern; a plurality of first via holes formed over the first metal layer pattern; a plurality of second via holes formed over the second metal layer pattern; and a plurality of third metal layer patterns formed on the first insulating layer, the third metal layer patterns being filled in the first via holes and the second via holes and electrically connect the first metal layer pattern and the second metal layer pattern through the first and second via holes.

Another embodiment of the invention provides an array substrate comprising: a base substrate and a metal thin film connection structure as mentioned above, the metal thin film connection structure being on the base substrate.

Another embodiment of the invention provides a manufacturing method for a metal thin film connection structure, comprising forming a first metal layer pattern and a second metal layer pattern, the first metal layer pattern and the second metal layer pattern are separately disposed; forming a first insulating layer on the first metal layer pattern and the second metal layer pattern; forming a plurality of first via holes over the first metal layer pattern; forming a plurality of second via holes over the second metal layer pattern; and forming a plurality of third metal layer patterns on the first insulating pattern, the third metal layer patterns being filled in the first via holes and the second via holes and electrically connecting the first metal layer pattern and the second metal layer pattern.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b is a partial enlarged view of a metal thin film connection structure in FIG. 1a.

FIG. 3b is a partial enlarged view of the connection position in FIG. 3a.

DETAILED DESCRIPTION

Figure 1A:
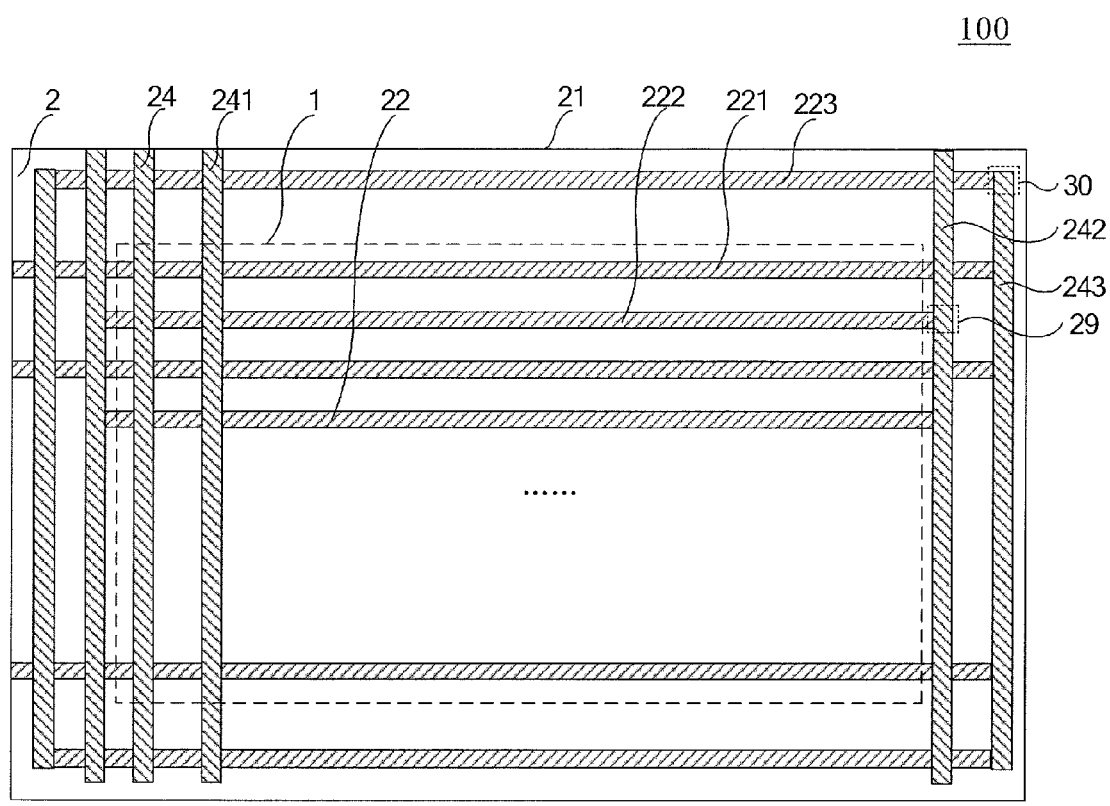
FIG. 1a is a diagram showing the structure of an array substrate according to a first embodiment of the invention.

The aim, technical solutions and other advantages of the embodiment of the invention will be more apparent by referring to the following further detailed description with referring to the drawings. Obviously, the embodiments provided herein are only a part of, but not all of, the embodiments of the invention. Based on these embodiments, all other embodiment of the invention will be apparent for those skilled in the art, and all of them should be included in the protection scope of the invention. In the description, when "A is 'on' B" is used, both the case in which A is directly on B and the case in which there is an intermediate layer between A and B are comprised.

Figure 1B:
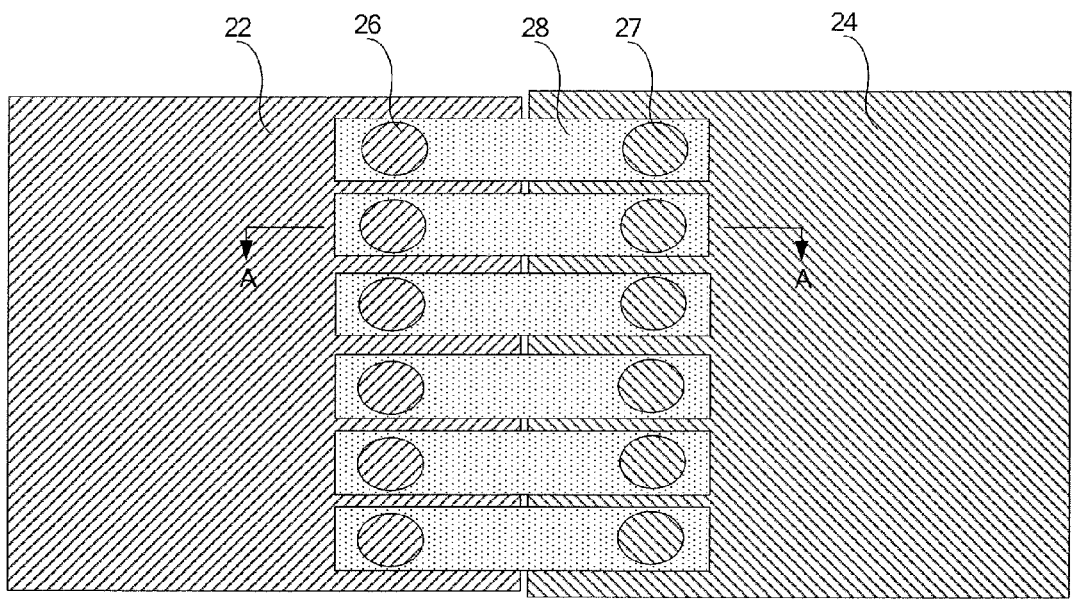
Figure 1C:
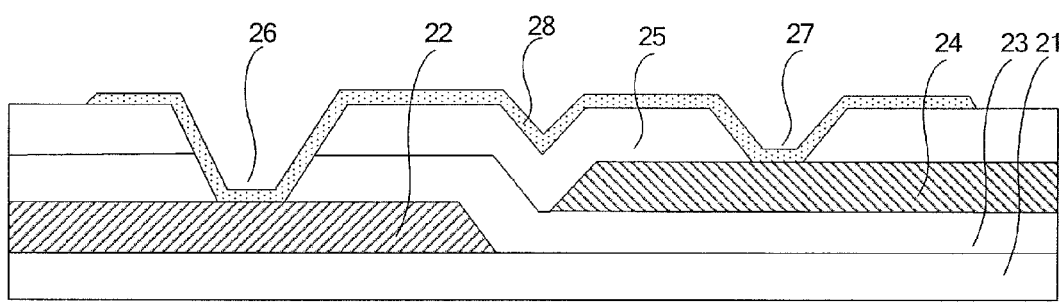
FIG. 1c is a cross sectional view taken along line A-A in FIG. 1b.

FIG. 1a is a diagram showing the structure of an array substrate according to a first embodiment of the invention; FIG. 1b is a partial enlarged view of a metal thin film connection structure in FIG. 1a; and FIG. 1c is a cross sectional view taken along line A-A in FIG. 1b. As shown in FIGS. 1a, 1b and 1c, the array substrate 100 comprises a base substrate 21 and metal thin film connection structures. In FIG. 1a, a metal thin film connection structure 29 and a metal thin film connection structure 30 are shown. The metal thin film connection structures 29 and 30 can have a similar configuration, e.g., each of them comprises a first metal layer pattern 22, an interlayer insulating layer 23, a second metal layer pattern 24, an outer insulating layer 25, a plurality of first via holes 26, a plurality of second via holes 27 and a plurality of third metal layer patterns 28.

The first metal layer pattern 22 is formed on the base substrate 21. The interlayer insulating layer 23 is formed on the first metal layer pattern 22 and the base substrate 21. The second metal layer pattern 24 is formed on the interlayer insulating layer 23. The outer insulating layer 25 is formed on the second metal layer pattern 24 and the interlayer insulating layer 23. Therefore, the first and second metal layer pattern 22 and 24 are separately provided.

The first via holes 26 are formed passing through the interlayer insulating 23 and the outer insulating layer 25 and are located over the first metal layer pattern 22. As shown in FIG. 1b, the first via holes 26 can be arranged in one or more columns, and one column of first via holes 26 are taken as an example for the description of the embodiment. Under the first via holes 26, only the first metal layer pattern 22 is formed, and the second metal layer pattern 24 is not formed there.

The second via holes 27 are formed passing through the outer insulating layer 25 and are located over the second metal layer pattern 24. The second via holes 27 are provided in opposition to the first via holes 26. As shown in FIG. 1b, the second via holes 27 can be arranged in one or more columns and one column of second via holes 27 are taken as an example for the description. Specifically, each row of second via holes 27 can correspond to one row of first via holes 26.

The third metal layer patterns 28 are on the outer insulating layer 25 and filled in the first via holes 26 and the second via holes 27, thus connecting the first metal layer pattern 22 and the second metal layer pattern 24 through the first via holes 26 and the second via holes 27. In the embodiment, each of the third metal layer patterns 28 may connect one of the first via holes 26 and one of the second via holes 27, i.e., each of the third metal layer patterns 28 is filled in one of the first via holes 26 and one of the second via holes 27. As shown in FIG. 1b, one of the third metal layer patterns 28 is formed on each row of first via holes 26 and one row of via holes 28 corresponding to the row of first via holes 26. Thus, in the embodiment, a plurality of third metal layer patterns 28 are separately provided. The third metal layer patterns 28 may be a transparent electrode pattern, for example, the transparent electrode pattern may be indium tin oxide (ITO), indium zinc oxide (IZO) or the like. The third metal layer patterns 28 may be of a strip configuration.

As shown in FIG. 1a, the array substrate comprises a pixel region 1 and a wiring region 2 which is located at the periphery of the pixel region 1. The metal thin film connection structures may be located within the pixel region 1 and/or the wiring region 2. A metal thin film connection structure formed in the wiring region 2 is taken as an example for describing purpose. In the embodiment, the first metal layer pattern 22 may be formed of a gate metal layer, and the second metal layer pattern 24 may be formed of a data metal layer. For example, in the embodiment, the first metal layer pattern 22 comprises a gate line 221, a common electrode line 242, and a reparation line 223; and the second metal layer pattern 24 comprises a data line 241, a common electrode connecting line 242 and a reparation line 243, as shown in FIG. 1a. For example, the reparation line 223 and the reparation line 243 are located in the wiring region 2, and the gate line 221, the common electrode line 222, the data line 241 and the common electrode connecting line 242 are located in the pixel region 1 and the wiring region 2. For example, in the metal thin film connection structure 29 as shown in FIG. 1a, the first metal layer pattern 22 is the common electrode line 222, and the second metal layer pattern 24 is the common electrode connecting line 242. The function of the common electrode connecting line 242 is to connect a plurality of common electrode lines together to keep them at the same potential. In the metal thin film connection structure 30, the first metal layer pattern 22 is the reparation line 223, and the second metal layer pattern 24 is the reparation line 243.

Figure 1D:
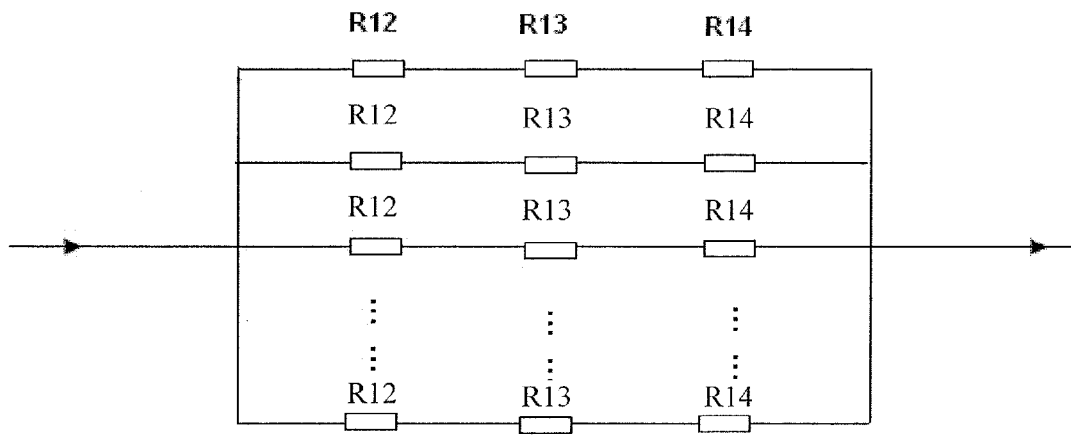
FIG. 1d is an equivalent circuit diagram of the metal thin film connection structure in FIG. 1b.

The plurality of third metal layer patterns 28 connecting the first metal layer pattern 22 and the second metal layer pattern 24 have a parallel connection configuration. FIG. 1d is an equivalent circuit diagram of the metal thin film connection structure in FIG. 1b. As shown in FIG. 1b, since the resistances of the first metal layer pattern 22 and the second metal layer 24 are much smaller than those of the third metal layer patters 28, the resistances of the first metal layer pattern 22 and the second metal layer 24 can be omitted in FIG. 1b. In FIG. 1b, R12 is the resistor having the contact resistance between each of the third metal layer patterns 28 and the first metal layer pattern 22 at the location of each of the first via holes 26, R14 is the resistor having the contact resistance between each of the third metal layer patterns 28 and the second metal layer pattern 24 at the location of each of the second via holes 27, R13 is the equivalent resistor of each of the third metal layer patterns 28 between the first metal layer pattern 22 and the second metal layer pattern 24, i.e., R13 is the equivalent resistor of each of the third metal layer patterns 28 which electrically the first metal layer pattern 22 with the second metal layer pattern 24. Since R13 are connected in parallel with each other, as shown in FIG. 1d, the whole equivalent circuit is of a parallel connection configuration. It can be seen from FIG. 1d that the current from the first metal layer pattern 22 flows through R12, R12 and R14 sequentially and reaches the second metal layer pattern 24. Since the equivalent circuit is of a parallel connection configuration, the current from the first metal layer pattern 22 is branched into components flowing each R13. That is to say, the current from the first metal layer pattern 22 is branched into each of the third metal layer patterns 28, avoiding third metal layer patterns 28 from being overheated and burned out due to concentrated current.

The array substrate according to the embodiment comprises a base substrate and a metal thin film connection structure. The metal thin film connection structure comprises a plurality of first via holes, a plurality of second via holes and a plurality of third metal layer patterns. The first via holes pass through an interlayer insulating layer and an outer insulating layer and are located over the first metal layer patterns, and the second via holes pass through the outer insulating layer and are located over the second metal layer pattern. The third metal layer patterns are on the outer insulating layer and connect the first metal layer pattern and the second metal layer pattern through the first and second via holes. Third metal layer patterns are located between the first via holes and the second via holes which are oppositely disposed. Thus, the current from the first metal layer pattern is branched into each of the third metal layer pattern, avoiding the third metal layer patterns between the first and second via holes from being overheated and burned out due to concentrated current. The signal current at the location of the connection structure is not necessary to be reduced if the array substrate according to the embodiment is employed, and thus a relatively large signal current can be used in the array substrate.

Figure 2:
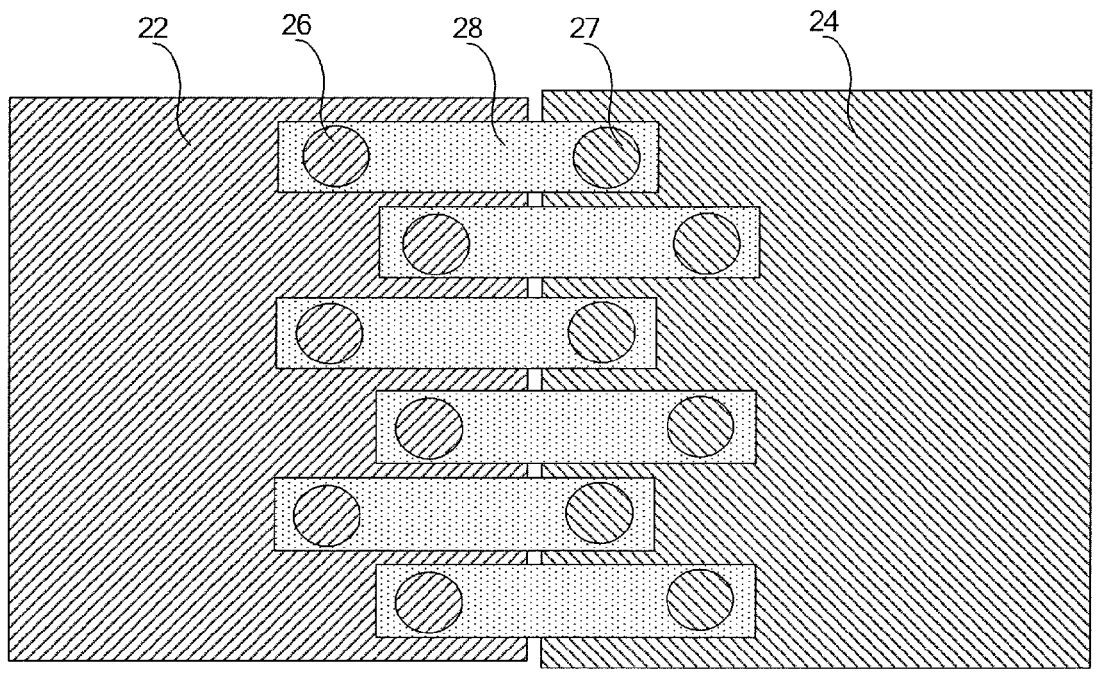
FIG. 2 is a partial enlarged view of a metal thin film connection structure in an array substrate according to a second embodiment of the invention.
Figure 3A:
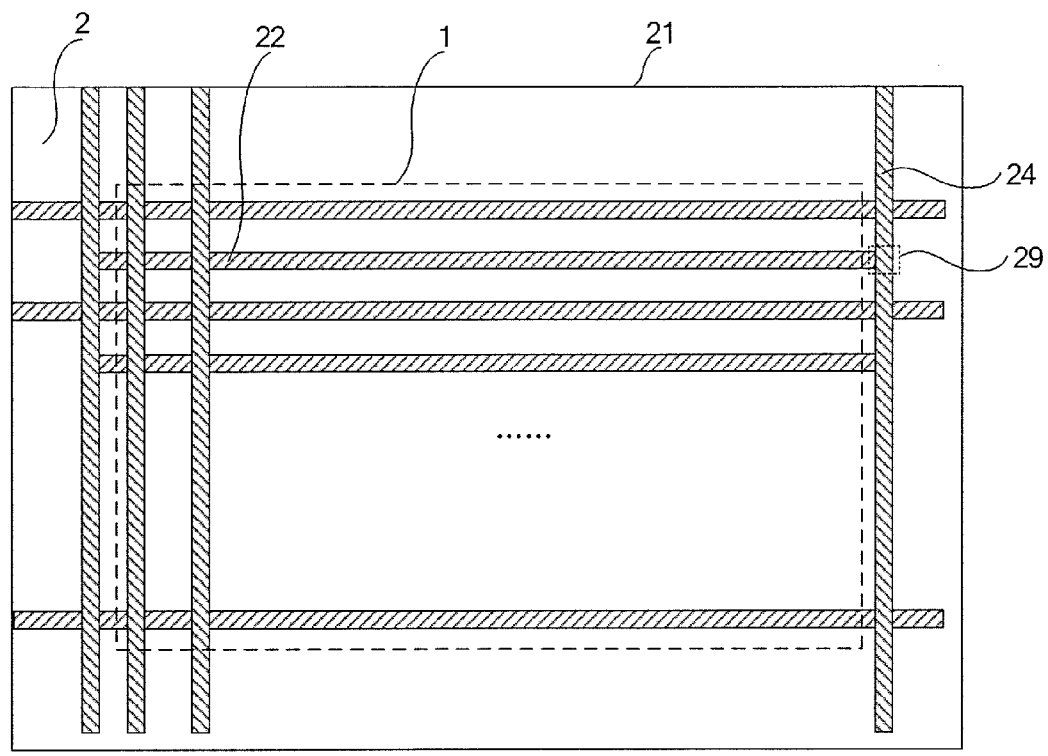
FIG. 3a is a diagram showing the structure of an array substrate.
Figure 3B:
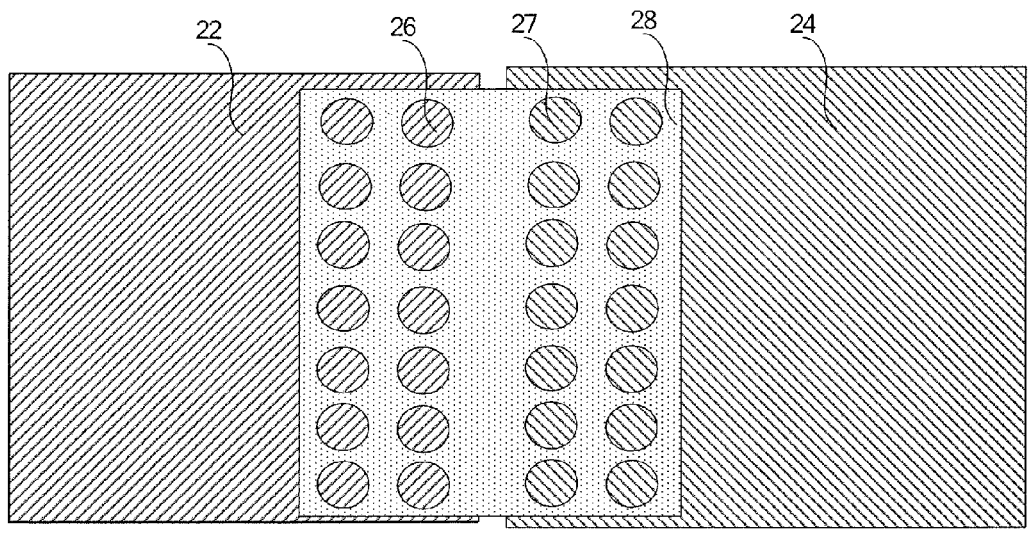
Figure 3C:
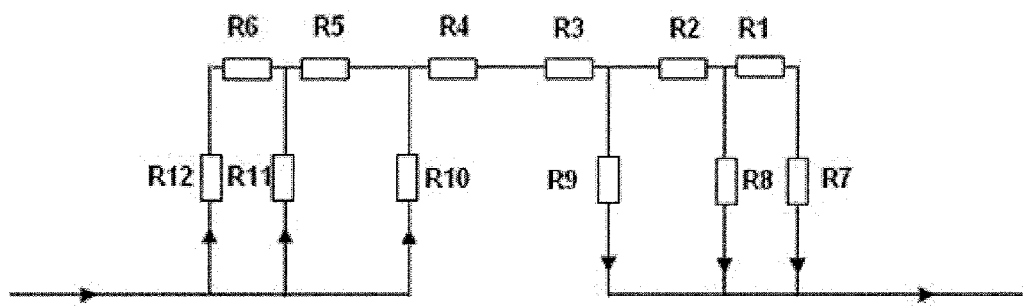
FIG. 3c is an equivalent circuit diagram of the connection position in FIG. 3b.

FIG. 2 is a partial enlarged view of a metal thin film connection structure of an array substrate according to a second embodiment of the invention. As shown in FIG. 2, the difference between the array substrate of the embodiment and the first embodiment mentioned above lies in that: in the present embodiment, a plurality of first via holes 26 are in a stagger arrangement, and a plurality of second via holes 27 are in a stagger arrangement. Specifically, the first via holes 26 under the adjacent third metal layer patterns are displaced with respect to each other, and the second via holes 26 under the adjacent third metal layer patterns are displaced with respect to each other. In the first embodiment, adjacent ones in the first via holes 26 are aligned with each other in the longitudinal direction; however, in the present embodiment, adjacent ones in the first via holes 26 are not disposed in the same column in the longitudinal direction, i.e., they are disposed in different columns in the drawing. Similarly, in the first embodiment, adjacent ones in the second via holes 27 are aligned with each other in the longitudinal direction; however, in the present embodiment, adjacent ones in the second via holes 27 are not disposed in the same column in the longitudinal direction, i.e., they are disposed in different columns in the drawing. Such a stagger arrangement contributes to a more smooth voltage reduction at the locations of the third metal layer patterns 28 between the first via holes 26 and the second via holes 27, avoiding the third metal layer patterns 28 between the first holes 26 and the second holes 27 from being overheated and burned out due to an abrupt voltage reduction. Further, such an stagger arrangement of the via holes is advantageous to increase the heat dissipation area; therefore, the heat generated when the currents flow through the third metal layer patterns 28 can be more easily dispersed, which is good to the heat dissipation of the third metal layer patterns 28 and prevent the third metal layer patters 28 between the first via holes 26 and the second via holes 27 from being overheated and burned out.

As for the other structures of the array substrate according to the embodiment, FIGS. 1a, 1c and 1d and the description in the first embodiment can be referred to, and the description will not be repeated here.

The embodiment of the invention provides an array substrate comprising a base substrate and a metal thin film connection structure. The metal thin film connection structure comprises a first metal layer pattern, a second metal layer pattern, an outer insulating layer, a plurality of first via holes, a plurality of second via holes and a plurality of third metal layer patterns. The first metal layer pattern is formed on the base substrate; the second metal layer pattern is disposed in the same layer as the first metal layer pattern and disposed separately with the first metal layer pattern; the outer insulating layer is formed on the first and second metal layer patterns and the base substrate between the first and second metal layer patterns. The first via holes are formed passing through the outer insulating layer and are located over the first metal layer pattern; the second via holes are formed passing through the outer insulating layer and are located over the second metal layer patterns, and the first via holes and the second via holes are oppositely disposed. The third metal layer patterns are formed on the outer insulating layer and electrically connect the first and second metal layer pattern through the first and second via holes. The third metal layer patterns are filled in the first via holes and the second via holes which are oppositely disposed.

In the embodiment, the array substrate comprises a pixel region and a wiring region which is at the periphery of the pixel region. The metal thin film connection structure may be formed in the pixel region and/or the wiring region. Further, the first metal layer pattern and the second metal layer pattern which are disposed in the same layer may be formed of a gate line metal layer or a data line metal layer.

In the embodiment, the plurality of third metal layer patterns which electrically connect the first and second metal layer patterns are of a parallel connection configuration.

Further, in the embodiment, the plurality of first via holes 26 may be in a stagger arrangement, and the plurality of second via holes 27 may be in a stagger arrangement.

The difference of the embodiment from the first and second embodiments lies in that: the second metal layer pattern in the embodiment is disposed in the same layer as the first metal layer pattern and disposed separately with the first metal layer pattern. As for the other structures, the description in the first embodiment can be referred to, and the description will not be repeated here.

As for the array substrate according to the embodiment, the current from the first metal layer patter can be branched into each of the third metal layer patterns, avoiding the third metal layer pattern between the first via holes and the second via holes from being overheated and burned out due to concentrated current. The signal current at the location of the connection structure is not necessary to be reduced if the array substrate according to the embodiment is employed, and thus a relatively large signal current may be used in the array substrate.

The embodiment of the invention also provides a metal thin film connection structure comprising a first metal layer pattern, a second metal layer pattern, an outer insulating layer, a plurality of first via holes, a plurality of second via holes and a plurality of third metal layer patterns. The first metal layer pattern and the second metal layer pattern are disposed separately. The outer insulating layer is formed on the first and second metal layer patterns. The first via holes are located over the first metal layer pattern; the second via holes are located over the second metal layer pattern, and the first via holes and the second via holes are oppositely disposed. The third metal layer patterns electrically connect the first and second metal layer pattern through the first and second via holes. The third metal layer patterns are filled in the first via holes and the second via holes which are oppositely disposed so as to electrically connect the first and second metal layer patterns.

In the embodiment, the third metal layer patter may be of a strip configuration.

In the embodiment, each of the third metal layer patterns connects one of the first via holes and one of the second via holes, i.e., each of the third metal layer patterns is only filled in one of the first via holes and one of the second via holes.

Further, the plurality of first via holes may be in a stagger arrangement, and the plurality of the second via holes may be in a stagger arrangement.

As for the specific description on the metal thin film connection structure in the embodiment, the description on the metal thin film connection structures in the first and second embodiments can be referred to, so omitted here.

As for the metal thin film connection structure provided in the embodiment, the current from the first metal layer pattern is branched into each of the third metal layer pattern, avoiding the third metal layer patterns between the first and second via holes from being overheated and burned out due to concentrated current.

A third embodiment of the invention provides a manufacturing method for a metal thin film connection structure, the method comprising:

Step 301, forming a first metal layer pattern and a second metal layer pattern, the first metal layer pattern and the second metal layer pattern are separately disposed;

Step 302, forming an outer insulating layer on the first and second metal layer patterns;

Step 303, forming a plurality of first via holes over the first metal layer pattern;

Step 304, forming a plurality of second via holes over the second metal layer pattern;

Step 305, forming a plurality of third metal layer patterns on the outer insulating layer, the third metal layer patterns are filled in the first via holes and the second via holes and electrically connect the first metal layer pattern and the second metal layer pattern.

As for the metal thin film connection structure manufactured by the manufacturing method according to the embodiment, the current from the first metal layer pattern is branched into each of the third metal layer pattern, avoiding the third metal layer patterns between the first and second via holes from being overheated and burned out due to concentrated current.

A fourth embodiment of the invention provides a manufacturing method for a metal thin film connection structure, the method comprising the following steps.

Step 401, forming a first metal layer pattern.

In the embodiment, the first metal layer pattern may be formed by a patterning process. Specifically, the first metal layer pattern may be formed on a base substrate by a patterning process. For example, a first metal layer can be deposited on the base substrate by a magnetic sputtering method. The thickness of the first metal layer can be in the range of 1000 Å to 7000 Å, and the material of the first metal layer may be molybdenum, aluminum, aluminum nickel alloy, molybdenum tungsten alloy, chromium, copper or the like. Masking, exposing and developing of photoresist, and etching processes are performed on the first metal layer, then the first metal layer pattern is formed on the base substrate.

Step 402, forming an interlayer insulating layer on the first metal layer pattern.

In the embodiment, the interlayer insulating layer is formed on the whole base substrate so that interlayer insulating layer can be formed on the first metal layer pattern. The thickness of the interlayer insulating layer may be 1000 Å to 6000 Å, and the material of the interlayer insulating layer may be silicon nitride, silicon oxide, silicon oxynitride or the like. Further, a semiconductor layer may be formed on the interlayer insulating layer. The thickness of the semiconductor layer may be in the range of 1000 Å to 6000 Å, and the material of the semiconductor layer may be an amorphous silicon thin film or a doped silicon thin film. Masking, exposing and developing of photoresist, and etching processes are performed on the semiconductor layer so as to from a semiconductor layer pattern on the interlayer insulating layer. The formed array substrate comprises a pixel region and a wiring region which is at the periphery of the pixel region. The metal thin film connection structure in the embodiment may be in the pixel region and/or the wiring region. If the metal thin film connection structure is in the pixel region, the metal thin film connection structure may comprise the semiconductor layer pattern; if the metal thin film connection structure is in the wiring region, the metal thin film connection structure may not include the semiconductor layer pattern, and the semiconductor layer may be etched away.

Step 403, forming a second metal layer on the interlayer insulating layer.

In the embodiment, the second metal layer may be formed on the interlayer insulating layer by a patterning process. Specifically, a second metal layer is deposited on the interlayer insulating layer by a magnetic sputtering method. The thickness of the second metal layer may be 1000 Å to 7000 Å, and the material of the second metal layer may be molybdenum, aluminum, aluminum nickel alloy, molybdenum tungsten alloy, chromium, copper or the like. Masking, exposing and developing of photoresist, and etching processes are performed on the second metal layer so as to form the second metal layer pattern on the interlayer insulating layer.

Step 404, forming an outer insulating layer on the first and second metal layer patterns.

In the embodiment, the outer insulating layer is formed on the whole base substrate and therefore on the first and second metal layer patterns. The thickness of the outer insulating layer may be in the range of 1000 Å to 6000 Å, and the material of the outer insulating layer may be silicon nitride or silicon dioxide.

Step 405, forming a plurality of first via holes through the interlayer insulating layer and the outer insulating layer, and the first via holes being located over the first metal layer pattern; and forming a plurality of second via holes through the outer insulating layer, and the second via holes are located over the second metal layer pattern.

In the embodiment, the first and second via holes can be formed by a patterning process. Specifically, photoresist applying, exposing and developing of photoresist, etching, and lifting-off of photoresist are performed on the outer insulating layer and the interlayer insulating layer so as to form the first via holes in the outer insulating layer and the interlayer insulating layer; and photoresist applying, exposing and developing of photoresist, etching and lifting-off processes are performed on the outer insulating layer so as to form the second via holes in the outer insulating layer. In the embodiment, the formed first via holes pass through the interlayer insulating layer and the outer insulating layer, and the formed second via holes pass through the outer insulating layer.

In the embodiment, the plurality of the first via holes and the plurality of the second via holes may be formed simultaneously with the formation of the via holes in the passivation layer of thin film transistors for connection with pixel electrodes.

Step 406, forming a plurality of third metal layer patterns on the outer insulating layer. The third metal layer patters are filled in the first via holes and the second via holes and electrically the first metal layer patterns and the second metal layer patterns through the first and second via holes.

In the embodiment, the plurality of third metal layer patterns may be formed on the outer insulating layer by a patterning process. Specifically, a third metal layer is deposited on the base substrate after Step 405. The thickness of the third metal layer may be in the range of 100 Å to 1000 Å, and the material of the third metal layer may be ITO, IZO or the like. Photoresist applying, exposing and developing of photoresist, etching, and lifting-off of photoresist are performed on the third metal layer so as to form the third metal layer patterns on the outer insulating layer.

In the embodiment, the third metal layer patterns can be formed simultaneously with the formation of pixel electrodes of an array substrate.

In the embodiment, the plurality of the first via holes may be in a stagger arrangement, and a plurality of the second via holes may be in a stagger arrangement.

The plurality of third metal layer patterns between the oppositely disposed first and second via holes are of a parallel connection configuration.

The manufacturing method provided in the embodiment can be used to manufacture the metal thin film connection structure according to the embodiments.

As for the manufacturing method for the metal thin film connection structure provided in the embodiment, the metal thin film connection structure is provided with a plurality of first via holes, a plurality of second via holes and a plurality of third metal layer patterns, the first via holes are foamed through the interlayer insulating layer and the outer insulating layer and located over the first metal layer patterns, the second via holes are formed through the outer insulating layer and located over the second metal layer pattern, and the third metal layer patterns are on the outer insulating layer and electrically connect the first metal layer pattern and the second metal layer pattern through the first via holes and the second via holes. Thus, the current from the first metal layer pattern is branched into each of the third metal layer patterns, avoiding the third metal layer patterns from being overheated and burned out due to concentrated current.

A fifth embodiment of the invention provides a manufacturing method for a metal thin film connection structure comprising the follow steps.

Step 501, forming a first metal layer pattern and a second metal layer pattern, the first metal layer pattern and the second metal layer pattern being separately disposed.

In the embodiment, the first and second metal layer patterns may be formed by a patterning process. For example, a metal layer can be deposited on the base substrate by a magnetic sputtering method. The thickness of the metal layer may be in the range of 1000 Å to 7000 Å, and the material of the metal layer may be molybdenum, aluminum, aluminum nickel alloy, molybdenum tungsten alloy, chromium, copper or the like. Masking, photoresist exposing and developing, and etching processes are performed on the metal layer, and then the first and second metal layer patterns are formed. The first and second metal layer patterns disposed in the same layer may be formed of a gate line metal layer or a data line metal layer.

Step 502, forming an outer insulating layer on the first and second metal layer patterns.

In the embodiment, the outer insulating layer is formed on the whole base substrate so as to form the outer insulating layer on the first and second metal layer patterns. The thickness of the outer insulating layer may be 1000 Å to 6000 Å, and the material of the outer insulating layer may be silicon nitride or silicon dioxide.

Step 503, foaming a plurality of first via holes and a plurality of second via holes in the outer insulating layer, the first via holes being located over the first metal layer patterns, and the second via holes being located over the second metal layer pattern. The first via holes and the second via holes are oppositely disposed.

In the embodiment, the first and second via holes may be formed by a patterning process. Specifically, photoresist applying, exposing, developing, etching and lifting-off processes are performed on the outer insulating layer so as to form the first and second via holes in the outer insulating layer. In the embodiment, the formed first via holes pass through the outer insulating layer, and the formed second via holes pass through the outer insulating layer.

Step 504, forming a plurality of third metal layer patterns on the outer insulating layer. The third metal layer patterns are filled in the first via holes and the second via holes and electrically the first metal layer patterns and the second metal layer patterns through the first and second via holes.

In the embodiment, the plurality of third metal layer patterns may be formed on the outer insulating layer by a patterning process. Specifically, a third metal layer is deposited on the base substrate after Step 503. The thickness of the third metal layer may be in the range of 100 Å to 1000 Å, and the material of the third metal layer may be ITO, IZO or the like. Photoresist applying, exposing, developing, etching and lifting-off processes are performed on the third metal layer so as to form the third metal layer patterns on the outer insulating layer.

In the embodiment, the third metal layer patterns may be formed simultaneously with the formation of pixel electrodes of an array substrate.

In the embodiment, the plurality of the first via holes may be in a stagger arrangement, and a plurality of the second via holes may be in a stagger arrangement.

The plurality of third metal layer patterns between the oppositely disposed first and second via holes are of a parallel connection configuration.

The manufacturing method provided in the embodiment may be used to manufacture the metal thin film connection structure according to the embodiments, and the method has the steps for forming the corresponding structures.

As for the manufacturing method for the metal thin film connection structure provided in the embodiment, the metal thin film connection structure is provided with a plurality of first via holes, a plurality of second via holes and a plurality of third metal layer patterns, the first via holes are faulted in the outer insulating layer and located over the first metal layer patterns, the second via holes are formed in the outer insulating layer and located over the second metal layer patterns, and the third metal layer patterns are on the outer insulating layer and electrically connect the first metal layer pattern and the second metal layer pattern through the first via holes and the second via holes. Thus, the current from the first metal layer pattern can be branched into each of the third metal layer patterns, avoiding the third metal layer patterns from being overheated and burned out due to concentrated current.

The array substrate in the embodiment of the invention comprises a base substrate and a metal thin film connection structure formed on the base substrate. The metal thin film connection structure may be manufactured by using the method according to any of the third, fourth and fifth embodiments.

The forming sequence of the various layers in the array substrate according to any embodiment of the invention may be modified as necessary, and other layers may be further formed in the stacked layers. The array substrate according to the invention is not limited to those as described in each embodiment and the drawings. The embodiments of the invention may be adapted in the structural design to different metal line connection locations in any wiring regions of thin film array structure.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A metal thin film connection structure, comprising:
   a first metal layer pattern;
   a second metal layer pattern which is separately disposed with the first metal layer pattern;
   a first insulating layer formed on the first metal layer pattern and the second metal layer pattern;
   a plurality of first via holes formed over the first metal layer pattern;
   a plurality of second via holes formed over the second metal layer pattern; and
   a plurality of third metal layer patterns formed on the first insulating layer, the third metal layer patterns being filled in the first via holes and the second via holes and electrically connect the first metal layer pattern and the second metal layer pattern through the first and second via holes,
   wherein the plurality of third metal layer patterns are separately provided.

2. The metal thin film connection structure of claim 1, wherein the plurality of first via holes are in a stagger arrangement.

3. The metal thin film connection structure of claim 1, wherein the plurality of second via holes are in a stagger arrangement.

4. The metal thin film connection structure of claim 1, wherein each of the third metal layer patterns is filled in one of the first via holes and one of the second via holes.

5. The metal thin film connection structure of claim 1, wherein the third metal layer patterns are of a strip configuration.

6. The metal thin film connection structure of claim 1, wherein the plurality of third metal layer patterns connecting the first metal layer pattern and the second metal layer pattern are of a parallel connection configuration.

7. The metal thin film connection structure of claim 1, wherein the first and second metal layer patterns are disposed in the same layer, and the first and second via holes pass through the first insulating layer, respectively.

8. The metal thin film connection structure of claim 1, further comprising a second insulating layer, wherein the second insulating layer is formed on the first metal layer pattern, the second metal layer is formed on the second insulating layer, the first via holes pass through the first and second insulating layers, and the second via holes pass through the first insulating layer.

9. An array substrate, comprising:
   a base substrate; and
   a metal thin film connection structure according to claim 1, the metal thin film connection structure being formed on the base substrate.

10. The array substrate of claim 9, wherein the first and second metal layer patterns are disposed in the same layer, and the first and second via holes pass through the first insulating layer, respectively.

11. The array substrate of claim 9, further comprising a second insulating layer, wherein the second insulating layer is formed on the first metal layer pattern, the second metal layer is formed on the second insulating layer, the first via holes pass through the first and second insulating layers, and the second via holes pass through the first insulating layer.

12. The array substrate of claim 9, wherein each of the third metal layer patterns is filled in one of the first via holes and one of the second via holes.

13. The array substrate of claim 9, wherein the plurality of first via holes and/or the plurality of second via holes are in a stagger arrangement.

14. The array substrate of claim 9, wherein the plurality of third metal layer patterns connecting the first metal layer pattern and the second metal layer pattern are of a parallel connection configuration.

15. The array substrate of claim 9, comprising a pixel region and a wiring region which is at the periphery of the pixel region,
   wherein the metal thin film connection structure is formed in the pixel region and/or the wiring region; and the first metal layer pattern is formed of a gate metal layer, and the second metal layer pattern is formed of a data metal layer.

16. The array substrate of claim 9, comprising a pixel region and a wiring region which is at the periphery of the pixel region, wherein the metal thin film connection structure is formed in the pixel region and/or the wiring region; and the first and second metal layer patterns are disposed in the same layer and formed of a gate metal layer or a gate metal layer.

17. A manufacturing method for a metal thin film connection structure, comprising,
   forming a first metal layer pattern and a second metal layer pattern, the first metal layer pattern and the second metal layer pattern are separately disposed;
   forming a first insulating layer on the first metal layer pattern and the second metal layer pattern;
   forming a plurality of first via holes over the first metal layer pattern;
   forming a plurality of second via holes over the second metal layer pattern; and
   forming a plurality of third metal layer patterns on the first insulating pattern, the third metal layer patterns being filled in the first via holes and the second via holes and electrically connecting the first metal layer pattern and the second metal layer pattern,
   wherein the plurality of third metal layer patterns are separately provided.

18. The manufacturing method for the metal thin film connection structure of claim 17, wherein the plurality of first via holes and the plurality of second holes are formed simultaneously with a passivation layer of a thin film transistor; and the third metal layer patterns are formed simultaneously with a pixel electrode of an array substrate.

19. The manufacturing method for the metal thin film connection structure of claim 17, wherein the first and second metal layer patterns are disposed in the same layer, and the first and second via holes pass through the first insulating layer, respectively.

20. The manufacturing method for the metal thin film connection structure of claim 17, after forming the first metal layer and before forming the second metal layer, further comprising:

forming a second insulating layer on the first metal layer pattern, wherein the second metal layer pattern is formed on the second insulating layer, the first via holes pass through the first and second insulating layers, and the second via holes pass through the first insulating layer.

* * * * *